US009291677B1

(12) United States Patent
Korpi et al.

(10) Patent No.: US 9,291,677 B1
(45) Date of Patent: Mar. 22, 2016

(54) TEST SYSTEM AND METHOD FOR TESTING ELECTROMECHANICAL COMPONENTS

(71) Applicants: ADVANCED TESTING TECHNOLOGIES, INC., Happauge, NY (US); Eli Levi, Dix Hills, NY (US)

(72) Inventors: Emery Korpi, Syosset, NY (US); Eli Levi, Dix Hills, NY (US); Peter F Britch, Miller Place, NY (US)

(73) Assignee: Advanced Testing Technologies, Inc., Hauppauge, NY (US)

( * ) Notice: Subject to any disclaimer, the term of this patent is extended or adjusted under 35 U.S.C. 154(b) by 494 days.

(21) Appl. No.: 13/888,540

(22) Filed: May 7, 2013

Related U.S. Application Data (60) Provisional application No. 61/644,490, filed on May 9, 2012.

(51) Int. Cl.
  *G06F 11/00* (2006.01)
  *G01R 31/34* (2006.01)

(52) U.S. Cl.
  CPC ...................................... *G01R 31/34* (2013.01)

(58) Field of Classification Search
  CPC .... H03F 1/3229; H03F 2200/451; H03F 3/24
  USPC .............. 702/33, 34, 117, 118, 182–185, 188
  See application file for complete search history.

(56) References Cited

U.S. PATENT DOCUMENTS

| 3,646,438 | A | 2/1972 | Staff |
| 4,255,789 | A * | 3/1981 | Hartford ............... F02D 41/263 |
| | | | 123/406.65 |
| 4,300,205 | A | 11/1981 | Tansuwan |
| 4,423,336 | A | 12/1983 | Iverson et al. |
| 6,876,942 | B2 | 4/2005 | Hagerott et al. |
| 7,065,466 | B2 | 6/2006 | Clarke et al. |
| 7,457,717 | B2 | 11/2008 | Davidson |
| 7,683,842 | B1 | 3/2010 | Engel et al. |
| 8,108,191 | B1 | 1/2012 | Britch |
| 8,131,529 | B2 | 3/2012 | Spinner et al. |
| 8,249,845 | B1 | 8/2012 | Britch et al. |
| 8,489,381 | B1 | 7/2013 | Spinner et al. |

OTHER PUBLICATIONS

MTS Insight® Electromechanical Testing Systems, MTS Systems Corporation, Eden Prairie, MN, 2009.

* cited by examiner

*Primary Examiner* — Edward Raymond
(74) *Attorney, Agent, or Firm* — Brian Roffe (57) ABSTRACT

Method and system that produce requisite drive signals to fully exercise and test electromechanical elements of a liquid rocket stage including solenoid valve drives, DC motor drives and actuator drive signals. The electrical driver tester includes a signal processor, power driver circuits, and A/D and D/A circuits to monitor and control the drive circuitry. Drive current is monitored and a signal proportional to the current is produced for the purpose of analyzing current profiles as part of the test regimen for the device under test. Actuator speed and positioning are controlled in real time with a tailored lead lag control algorithm implemented with digital signal processor hardware.

19 Claims, 10 Drawing Sheets

TEST SYSTEM AND METHOD FOR TESTING ELECTROMECHANICAL COMPONENTS

CROSS REFERENCE TO RELATED APPLICATION

This application claims priority of U.S. provisional patent application Ser. No. 61/644,490 filed May 9, 2012, which is incorporated by reference herein.

FIELD OF THE INVENTION

The present invention relates generally to the field of automatic test systems for testing electromechanical components, including but not limited to solenoid valves, direct current (DC) motors and DC actuators, and more particularly, to automatic test equipment for evaluating operational characteristics of such electromechanical components within a liquid rocket stage assembly. To the extent different, the present invention also relates generally to devices and methods for testing components of electromechanical systems.

BACKGROUND OF THE INVENTION

Automated test equipment for testing the performance of rocket stage electromechanical components has been available for a number of years and is well established. Equipment is available to determine the characteristics of such components, such as valve open/close times, motor speed, motor friction, electrical noise and positioning accuracy.

The previous systems often utilized analog control circuitry that requires an intermediate system of interface circuitry between a test computer and an actuator control system.

As examples in the prior art, U.S. Pat. No. 6,876,942 (Hagerott et al.) describes methods and systems for enhanced automated system testing, and U.S. Pat. No. 7,457,717 (Davidson) describes a system for trouble shooting and verifying operation of spare assets.

SUMMARY OF THE INVENTION

An object of the present invention is to provide a more accurate and simpler system, than one that uses analog control circuitry as in the prior art, and/or that has a fully digital design with a direct digital data transfer between a test computer and an electromechanical device driver tester.

A method in accordance with the invention includes analog interfacing circuits, digital processing hardware and purpose-designed software algorithms to accurately control motor velocity and/or positioning. The design and method calculate in real-time, an optimal drive signal to control the velocity and/or position of the electric motors. The motor parameters of current, velocity and/or position are produced so they may be electrically monitored. These parameters may also be read directly from the device over a computer backplane.

Other objects, features and characteristics of the present invention, as well as methods of operation and functions of related elements of the structure, the combination of parts and economics of manufacture will become more apparent upon consideration of the following detailed description and appended claims with reference to the accompanying drawings, all of which form a part of this specification.

BRIEF DESCRIPTION OF THE DRAWINGS

The following drawings are illustrative of embodiments of the invention and are not meat to limit the scope of the invention as encompassed by the claims.

FIGS. 2A, 2B and 2C show circuitry being tested by this device, wherein

DETAILED DESCRIPTION OF PREFERRED EMBODIMENTS

Preferred embodiments of the invention will be described with reference to FIGS. 1-5D wherein the same reference numerals refer to the same or similar elements.

Figure 1:
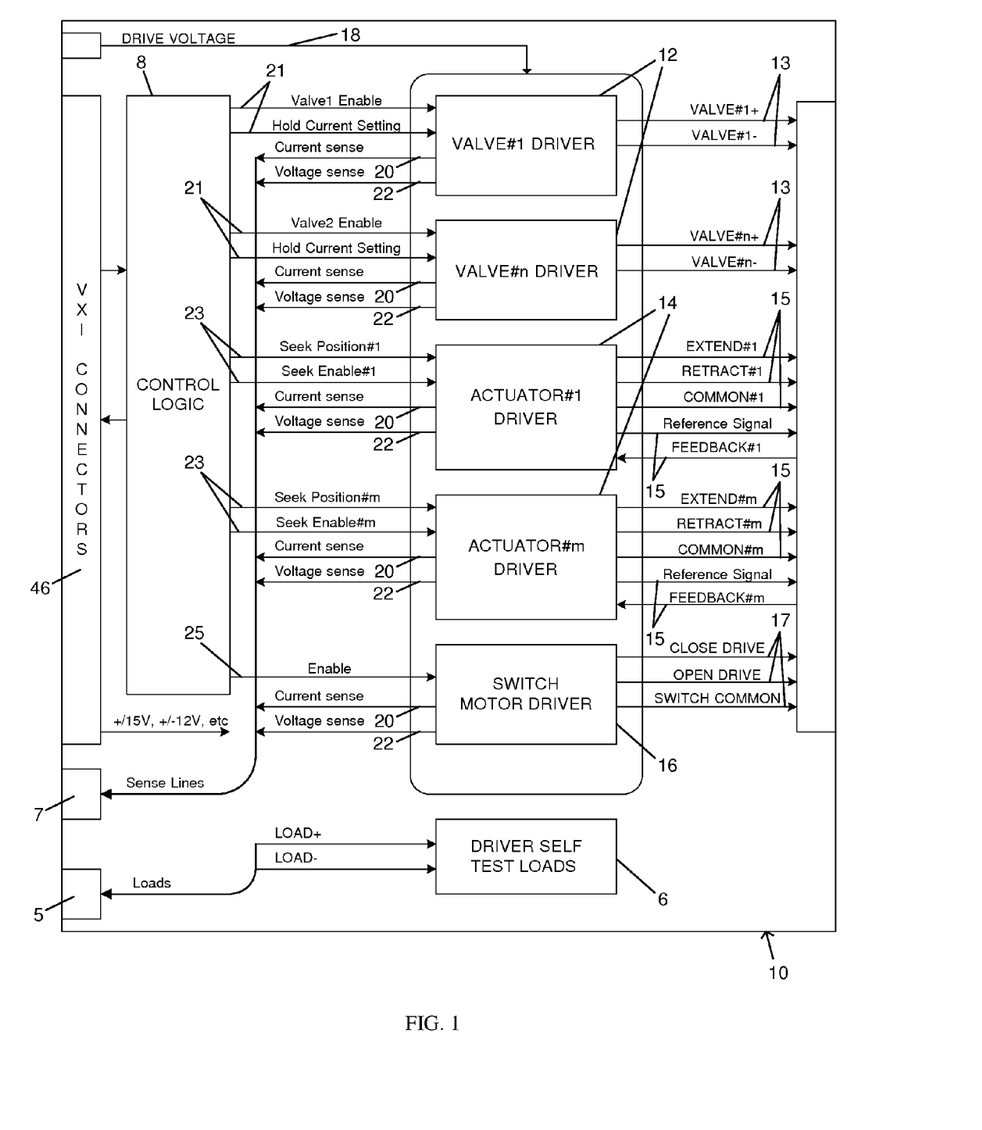
FIG. 1 shows a functional block diagram of the present invention showing three types of circuit drivers.

FIG. 1 is a block diagram of an example of a basic circuit 10 used in the present invention. The circuit 10 contains three different types of drivers, valve or solenoid drivers 12, actuator drivers 14, and a switch motor driver 16, only one of which is shown in FIG. 1. The number of each type of driver can vary depending on the needs and use of the systems. There may be multiple instances of each of the driver types. In some embodiments, the circuit 10 could be designed with less than all three types of drivers, as well as with one or more additional types of drivers. Also, the circuit 10 may be designed with all three different types of drivers but, during operation, use only one type or only two types.

The device in accordance with the invention preferably uses a common drive voltage from a source thereof 18, for all of the drivers 12, 14, 16 so that changing this common drive voltage from source 18 causes changes in the drive voltage to all drivers 12, 14, 16 simultaneously. Each driver 12, 14, 16 has a pair of analog sense lines 20, 22 to monitor the drive voltage and current, respectively. These drive voltage and current signals may be monitored with test instruments, such as digital multi meters or oscilloscopes, to determine device performance characteristics, including but not limited to valve opening and closing times represented by the output from the valve drivers 12, motor spin rates, actuator accuracy and brush noise. To this end, the sense lines lead to a connector 7 on the backplane Loads are provided as part of the device to determine if each of the drivers 12, 14, 16 is functioning within its ratings. Thus, there are driver self-test loads 6 leading to a connector 5 on the backplane as shown in FIG. 1.

As also shown in FIG. 1, a control logic 8 is provided between one or more VXI backplane connectors 46 and the drivers 12, 14, 16. The control logic 8 provides various signals to the drivers 12, 14, 16, e.g., a respective set of valve enable and hold current setting signals to each valve driver 12, a respective set of seek position and seek enable signals to each actuator driver 14, and an enable signal to each switch motor driver 16. The control logic 8 may comprise a microprocessor as well as other computer hardware and/or software necessary to implement the invention, which hardware and/or software would be readily identifiable by one skilled in the art without undue experimentation. More generally, the control logic 8 may be referred to as a processor or processor means.

Each valve driver 12 provides valve open and close signals via lines 13. Each actuator driver 14 provides and receives several signals via lines 15, such as providing an extend, retract, common and reference signals and receiving a feedback signal. Each switch motor driver 16 provides a close drive, open drive and switch common signals via lines 17.

Additional features of the valve driver 12 include the configuration of the valve driver 12 to include or supply a high current FET switch that connects the power of the test system including circuit 10 to the valve under test, e.g., valve 24 discussed below. Additionally or alternatively, the valve driver 12 can supply a programmable current to the valve under test. The current serves to model as the worst case leakage current of the valve under test at the system level. Additionally or alternatively, the valve driver 12 may be configured to supply a matching network of zener diode and snubber resistor such that the valve hysteresis current does not produce large voltage spikes at the FET switch/driver. Moreover, current and voltage through the valve under test are available as analog signals such that these signals may be further monitored by analog test instruments for electro mechanical parametric measurements of valve open time, valve closing time and losses within the valve. The manner in which such signals may be processed to enable review are known to those skilled in the art to which the invention pertains.

Additional features of the actuator driver 14 include the configuration of the switch motor driver 16 to include or supply a high current FET switch that connects the test system power to the extend and retract motor of the actuator under test, e.g., actuator 26 discussed below. Additionally or alternatively, the actuator driver 14 may be configured to supply a programmable current to the actuator under test. The current is generated by switching the FET switch or switches at a constant frequency with a pulse width modulation (PWM) methodology to control the acceleration and speed of the actuator. Additionally or alternatively, the actuator driver 14 may be configured to supply a matching network of zener diode(s) and snubber resistor(s) such that the extend and retract motor hysteresis current does not produce large voltage spikes at the FET driver. The voltage to the extend and retract motors and the combined current of both motors for each actuator under test are available as analog signals such that these signals may be further monitored by analog test instruments for electro mechanical parametric measurements of actuator lag, rate, position accuracy, motor brush noise and losses within the motors. The manner in which such signals may be processed to enable review are known to those skilled in the art to which the invention pertains.

Using the control logic, additional control schemes involving the actuator drivers 14 are possible. For example, the control logic 8 may be configured to accurately position the actuators 26 with a minimum overshoot or undershoot in actuator positioning and/or actuator control current, to fold back the drive current at the end stops of the actuator so that damage to the mechanical end stops is prevented and to accurately measure the actuator position digitally over the VXI bus interface.

Additional features of the switch motor driver 16 include the configuration of the switch motor driver 16 to include or supply a high current FET switch that connects the test system power to the motorized switch under test, e.g., switch 38 discussed below. Additionally or alternatively, the switch motor driver 16 can supply a matching network of zener diode(s) and snubber resistor(s) such that the motorized switch hysteresis current does not produce large voltage spikes at the FET driver. Moreover, current and voltage through the motor switch under test are available as analog signals such that these signals may be further monitored by analog test instruments for electro mechanical parametric measurements of motor voltage, motor current and/or motor brush noise. The manner in which such signals may be processed to enable review are known to those skilled in the art to which the invention pertains.

Figure 2A:
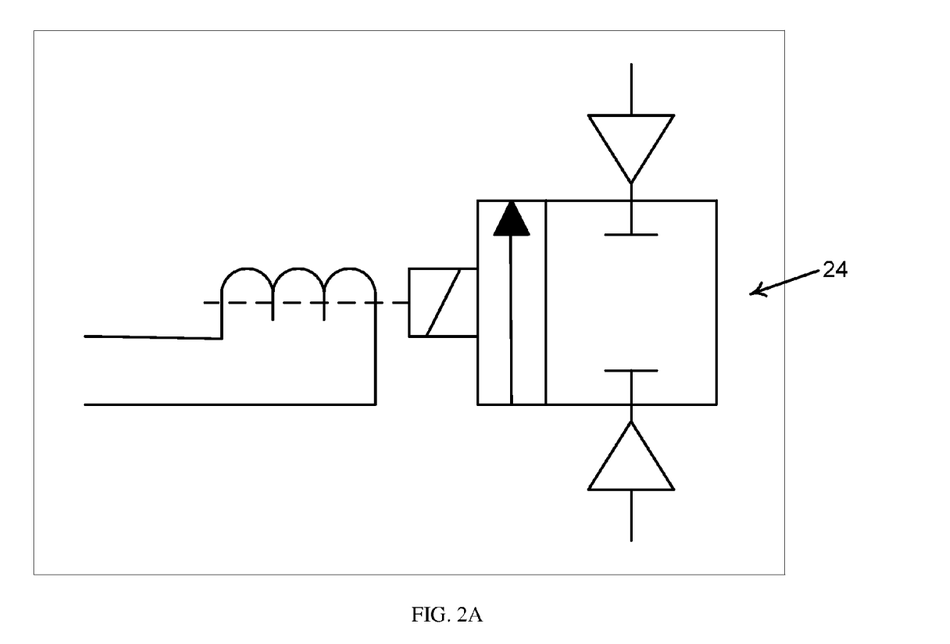
FIG. 2A is a schematic of a two-port solenoid valve that controls two gases flowing into a common chamber.

FIG. 2A is a schematic of a two-port solenoid valve 24 that is often used in a rocket stage to simultaneously open fuel and oxidizer valves to provide a combustible mix of fuel and oxidizer to a rocket engine thrust chamber, and its representation is understood by those skilled in the art. The solenoid valve 24 is driven by the one of the valve drivers 12 via the lines 13 depicted in FIG. 1. Other uses of the two-port solenoid valve 24 are also envisioned as being within the scope and spirit of the invention.

Figure 2B:
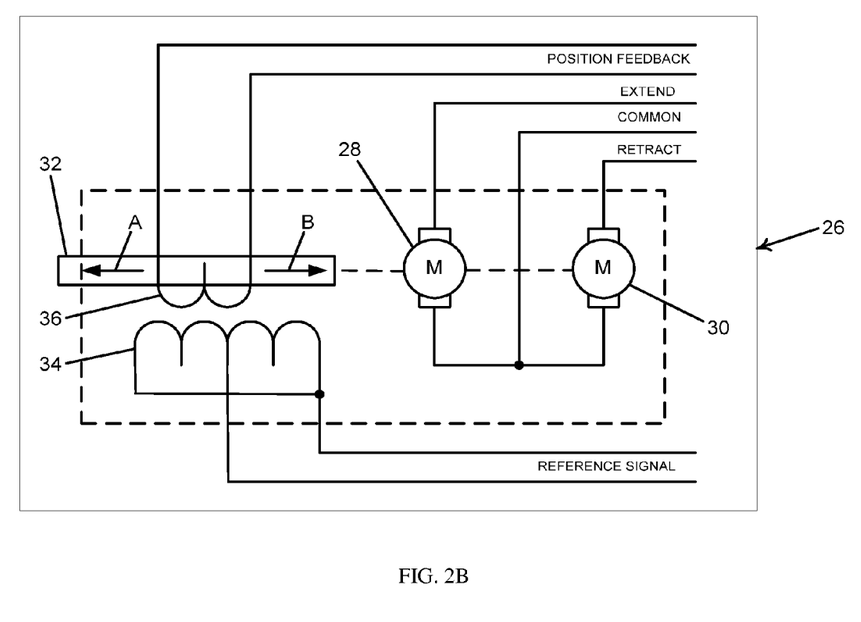
FIG. 2B is a schematic of the actuator device that is driven by an actuator driver showing extend and retract motors and a feedback transformer that generates feedback from a reference signal dependent on actuator shaft position.

FIG. 2B is a schematic of an actuator 26 with dedicated extend and retract motor terminals 28, 30, respectively. When the extend terminal 28 is provided with power or energized, a schematically represented actuator rod 32 of the actuator 26 extends outward (moves in the direction of arrow A) and when the retract terminal 30 is provided power or energized, the actuator rod 32 retracts inward (moves in the direction of arrow B). The reference signal 34 is typically an AC signal that drives a variable transformer 34. The transformer secondary 36 is mounted on the actuator rod 32, preferably such that maximum feedback values are obtained at the maximum extend or retract positions of the actuator rod 32 and a null value is obtained at a center position of the actuator rod 32. The position feedback signal obtained from the transformer secondary 36 is either "in phase" or "out of phase" with the reference signal driving the transformer 34 at the maximum extend and retract positions. The actuator 26 is driven by the actuator drivers 14, i.e., the extend and retract motor terminals are coupled to the corresponding lines 15 from one of the actuator drivers 14 shown in FIG. 1. Similarly, the common terminal is coupled to the respective common one of the lines 15 from the actuator driver 14 shown in FIG. 1, and the reference signal terminal is coupled to the respective reference signal one of the lines 15 from the actuator driver 14 shown in FIG. 1. Finally, the position feedback signal is provided to the actuator driver 14 via the respective one of the lines 15, see FIG. 1.

Figure 2C:
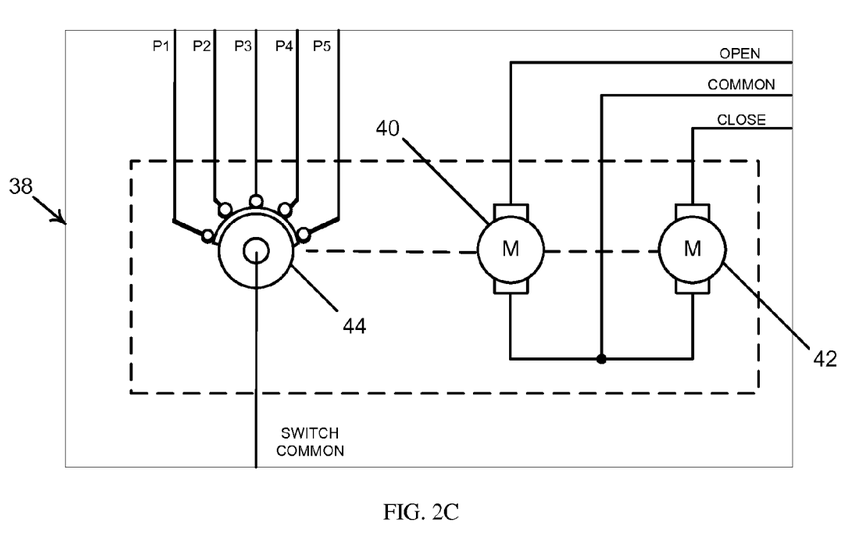
FIG. 2C is a schematic of the motor driven switch showing a common contact and multiple output contacts that sequentially engage as the motor moves the shaft from an open position to a close position.

FIG. 2C is a schematic of a motor driven switch 38 with dedicated open and close terminals 40, 42, respectively. When the open terminal 40 is provided power, a ganged switch 44 is moved to the all open position and when the close terminal 42 is provided power, the ganged switch 44 is moved to the all close position. The motor driven switch 38 may be driven by the switch motor driver 16 shown in FIG. 1. In particular, the open terminal to, close terminal 42 and common terminal are coupled to the corresponding lines 17 from one the switch motor driver 16 shown in FIG. 1.

Figure 3:
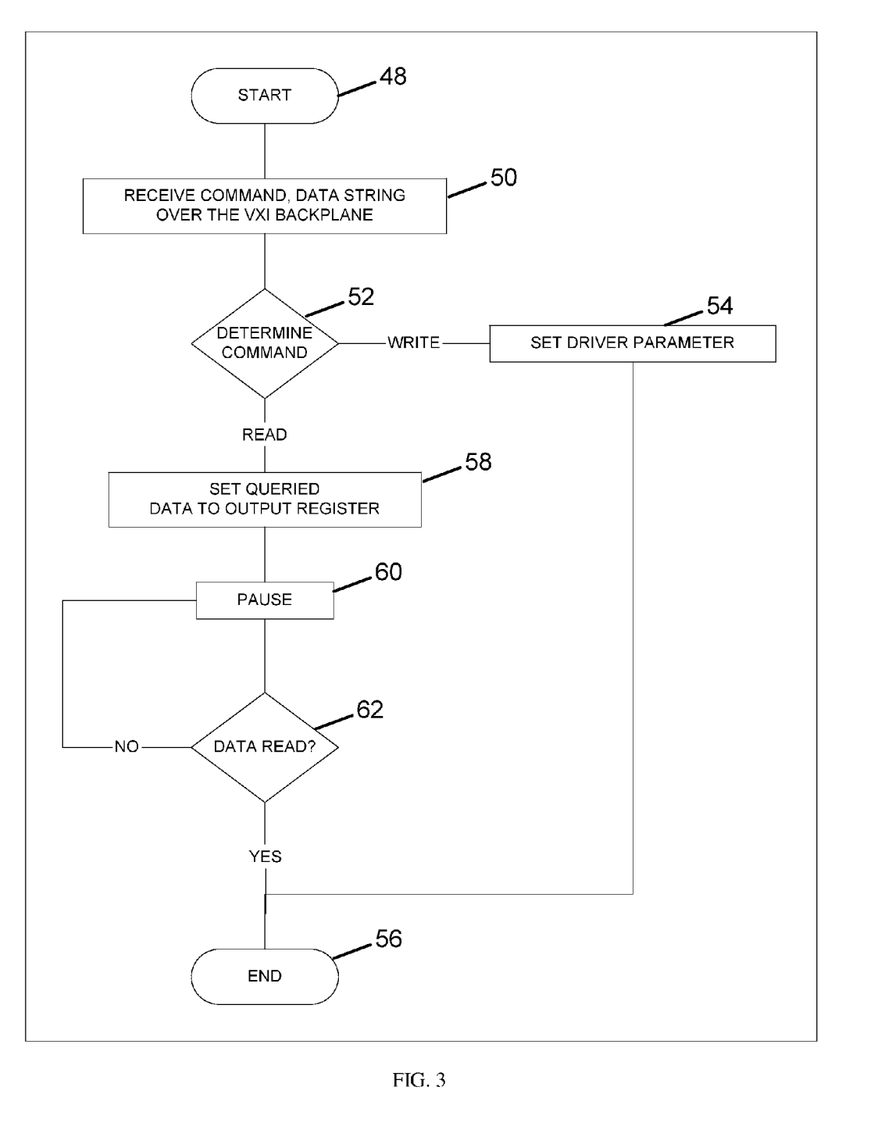
FIG. 3 shows the command interpreter that receives all the device commands over a VXI backplane.

FIG. 3 shows a software flow diagram of a command interpreter in accordance with an exemplifying embodiment of the invention. This flow diagram may be executed by a processor, including control logic 8 in FIG. 1, accessing a computer program embodied on non-transitory computer-readable media which is configured to provide the steps of the flow diagram.

After a start stage 48, commands are received, step 50, over VXI backplane connectors 46 shown in FIG. 1. The control logic 8, also shown in FIG. 1, receives and decodes each received command, step 52, and when necessary, sends control logic signals via lines 21, 23, 25 to control the three different types of drivers 12, 14, 16, and self-test loads (driver self-test loads 6 shown in FIG. 1) of this invention. The test loads 6 may be switched to, for example, the valve drivers 12, for the purpose of self-testing of the valve drivers 12, the actuator drivers 14 for the purpose of testing the actuator drives and the switch motor driver 16 for the purpose of testing the switch motor driver 16. The switching may be performed via the VXI backplane, or in any other manner known to those skilled in the art to which this invention pertains.

Command data consists of, for example, on/off enable settings for each driver 12, 14, 16 of the device 10, but the particular enable setting signals may differ for the different drivers 12, 14, 16. Additionally, the seek position data for each actuator driver 14 is set-up prior to giving the actuator-enable signal that enables the actuator control algorithm shown in FIGS. 5A-5D.

More specifically, if in step 52, the command is determined to be a "WRITE" command by the control logic 8, a driver parameter is set in step 54 and the flow diagram ends in step 56. If in step 52, the command is determined to be a "READ" command by the control logic 8, the queried data is set to an output register in step 58, a pause is taken at step 60 until a determination is made by the control logic 8 that data is read at 62, and after data is read in step 62, the flow diagram ends in step 56.

The "WRITE" and "READ" commands are exemplifying, non-limiting commands and other commands may be determined and processed accordingly by the control logic 8.

Figure 4:
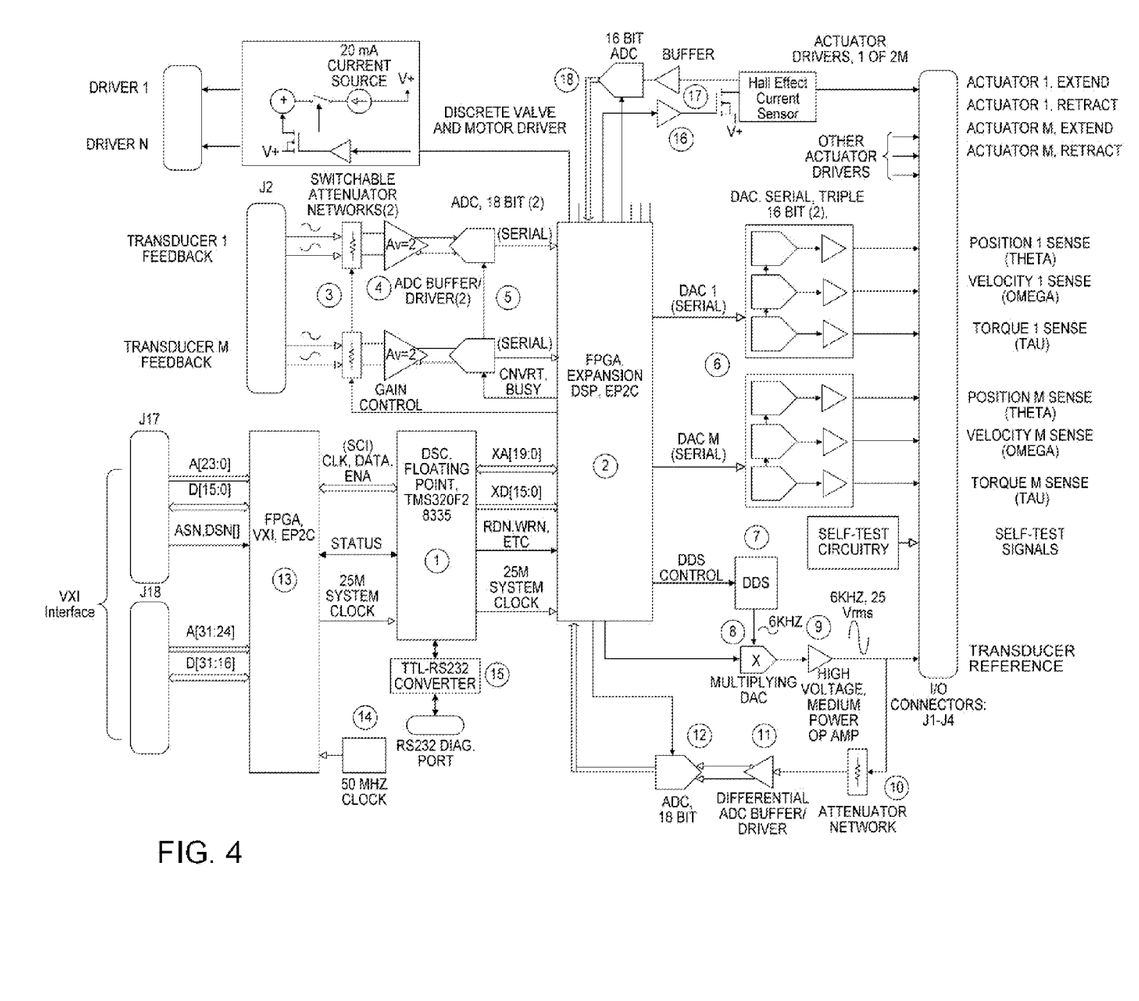
FIG. 4 shows a schematic of the electromechanical driver circuitry used to drive the devices shown in FIGS. 2A, 2B and 2C, including the discrete drivers that are used to drive the motor switch and solenoid valves, a schematic of the actuator driver used to drive the actuators, extend and retract portions of the driver, the reference excitation signal and the feedback interface.

FIG. 4 shows a top level schematic of a preferred embodiment of the invention, utilizing a Digital Signal Processor (DSP) 64 in a closed loop control system 66. The control system 66 is used to perform, for example, the control algorithms detailed in FIG. 5 to efficiently drive an actuator to a preprogrammed seek position. The system 66 includes the Digital Signal Processor 64 with floating point arithmetic capabilities connected via a parallel expansion bus to a Field Programmable Gate Array (FPGA) 68 used to expand the input/output of the DSP 64.

The DSP 64 contains, preferably in FLASH memory, all system functions and actuator seek algorithm. System functions include a VXI communication interface FPGA 70, actuator motor control 72, and all timing needed by other devices. Control system 66 also includes actuator drivers 74, sampling analog-to-digital (A/D) converters 76, dynamic actuator performance parameters D/A converters 78 and a direct digital synthesis (DDS) reference waveform generator 80.

The DDS reference waveform generator 80, a multiplying DAC 82, and a high voltage operational amplifier 84 form a precision sine wave signal reference source which drives the primary input transformer of the actuator reference signal input.

An attenuator network 86, a precision differential A/D buffer/driver 88 and an 18 bit A/D converter 90 form a means to sample and re-construct the transducer reference source. This is required in order to determine plus or minus actuator position.

A positional transducer feedback input stage is formed from switching gain attenuator networks 92, precision differential A/D buffer/drivers 94, one for each switching gain attenuator network 92, and an 18 bit A/D converter 76, one associated with each buffer/driver 94. The FPGA 68 serves as the ADC timing control and serial input register to hold the A/D conversion results. The DSP 64 is configured to trigger conversion to the FPGA 68 and reads the conversion results.

The DSP 64, FPGA 68 and dynamic actuator performance parameters D/A converters 78 comprise dynamic analog signal sense points for the actuator angular position (theta) and instantaneous angular velocity (omega) and actuator input torque (tau).

Actuator motor control 72 or drivers, are preferably saturated, high-side MOSFET devices used to provide power to each coil in either actuator.

The VXI communication interface FPGA 70 is preferably a host register-based VXI controller. An ancillary RS232 communication port 93 coupled to the DSP 64 is used for diagnostic purposes.

A buffer 94 and a 16 bit A/D converter 76 comprise a current sensing mechanism in each actuator drive coil. Current sensing provides protection for the actuator and is used to indicate a stalled condition, for example, as in resting against a physical end stop.

A buffer 98 and high-side MOSFET driver devices 100 are used to provide power to or for both valve drivers and motor drivers 12, 16. A 20 mA current source 102 is used to supply a leakage current for the valve drivers 12. Both motor drivers 16 and valve drivers 12 preferably contain flyback diodes and inline resistors to match the impedance of the valve or motor being tested.

FIGS. 5A-5D shows exemplifying software flows used for this invention.

Figure 5A:
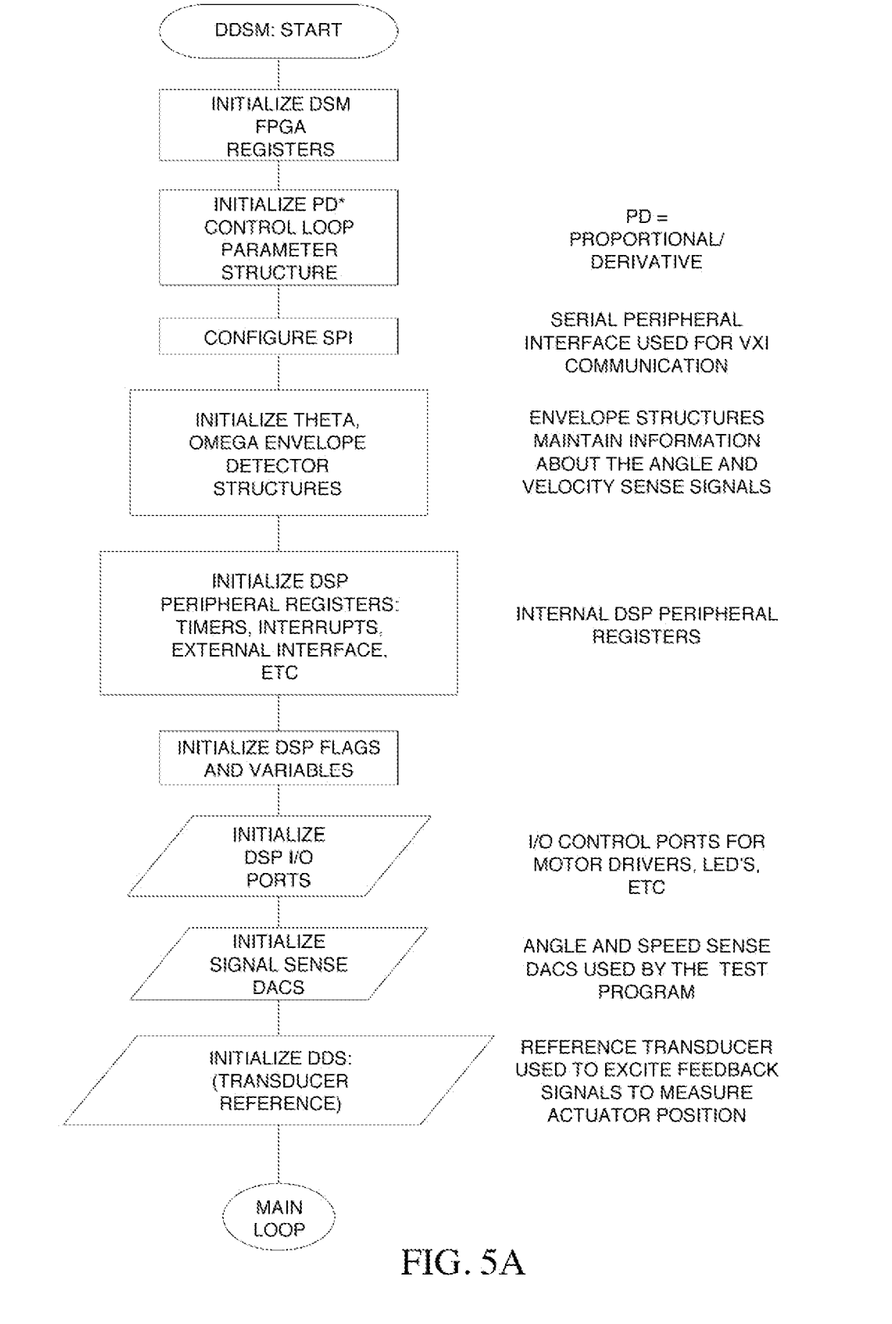
FIGS. 5A, 5B, 5C and 5D are software algorithm diagrams for the actuator driver, wherein the software is state-driven with differing tasks accomplished during the fixed timing cycle based upon the current operational state.

FIG. 5A shows an initialization process beginning with step 110. In step 112, the system FPGA registers are initialized and then in step 114, the proportional/derivative (PD) control loop parameter structure is initialized. The serial peripheral interface (SPI) used for VXI communication is configured in step 116. In step 118, theta (representing position), and omega (representing velocity) envelope detector structures are initialized. The envelope structures maintain information about the angle and velocity signals. In step 120, the internal DSP peripheral registers, timers, interrupts, external interfaces, etc. are initialized. The DSP flags and variables are initialized in step 122. Input/output (I/O) ports of the DSP 64 are initialized in step 124, which I/O control portions are for the motor drivers, LED's, etc. The signal sense DACs are initialized in step 126, these are the angle and speed sensor DACs used by the test program. Finally, the DDS 80, i.e., the transducer reference, is initialized in step 128. The reference transducer is used to excite feedback signals to measure actuator position. Once the initialization stage is complete, the process continues to the main loop 130. The manner in which the initialization and configuration steps are performed would be readily understood by one skilled in the art in view of the disclosure herein.

Figure 5B:
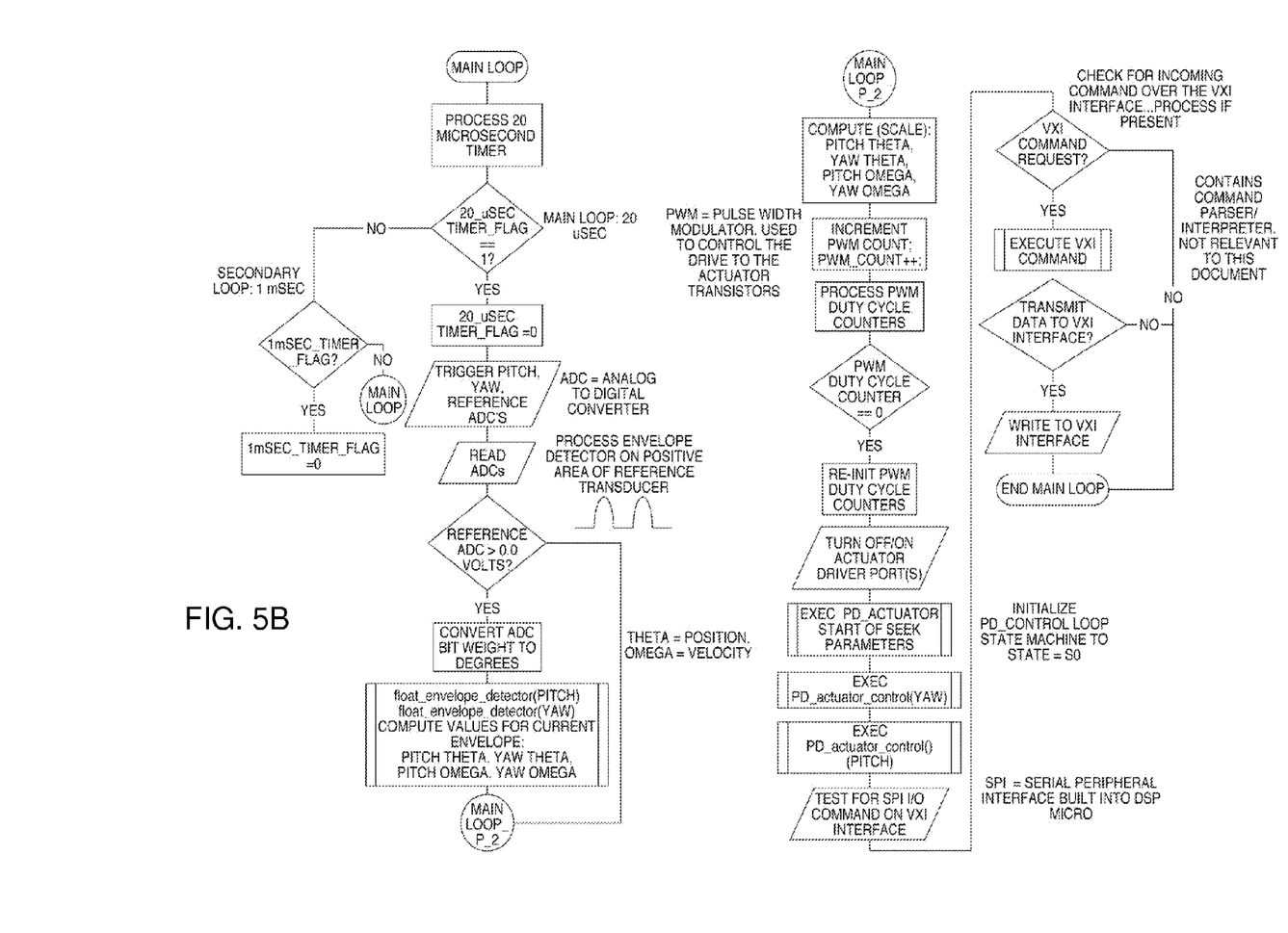

FIG. 5B shows the software main loop and periodic tasks that are executed within this loop. In step 132, a 20 micro second timer is processed and if a timer flag is determined to equal 1 in step 134, the timer flag is set back to zero in step 140. If not, a secondary loop is processed to determine whether a 1 millisecond (msec) timer flag has been tripped in step 136. If not, the process returns to the main loop 130. If so, the 1 msec timer flag is set to zero in step 138.

From step 140, the pitch, yaw and reference ADC's are triggered in step 142, read in step 144 and a determination is made in step 146 whether the reference ADC is greater than zero volts. If so, in step 148, the ADC bit weight is converted to degrees and in step 150, the values for the current envelope are computed, i.e., pitch theta, pitch omega, yaw theta and yaw omega. Then the process proceeds to part 2 of the main loop 152. If the reference ADC is not greater than zero volts, then the process proceeds to part 2 of the main loop 152.

In part 2 of the main loop 152, pitch theta, pitch omega, yaw theta and yaw omega are computed and may be scaled if so desired in step 154. In step 156, pulse width modulator (PWM) counters are incremented, which pulse width modulators are used to control the device to the actuator transistors. The PWNM duty cycle counters are processed in step 158, and a determination is made in step 160 whether any are equal to zero. If so, the PWM duty cycle counters are re-initialized in step 162.

Actuator drive portions are turned off or on in step 164, and a process is started in step 166 to seek parameters, i.e., a proportional/derivative actuator (PD_Actuator) process is started. A PD_Actuator_control process is executed in step 168 for the yaw condition and in step 170 for the pitch condition. In step 172, SPI I/O command on the VXI interface is tested for and a determination is made whether a VXI command request is present in step 174. This means that a check is made for an incoming command over the VXI interface. If not, the main loop ends at 182. On the other hand, if a command is present. The VXI command is executed at 176, and a determination is made at 178 whether data must be transmitted to the VXI interface. If not, the process ends at 182. If data is to be transmitted, the data is written to the VXI interface at 180 and then the process ends at 182.

Figure 5C:
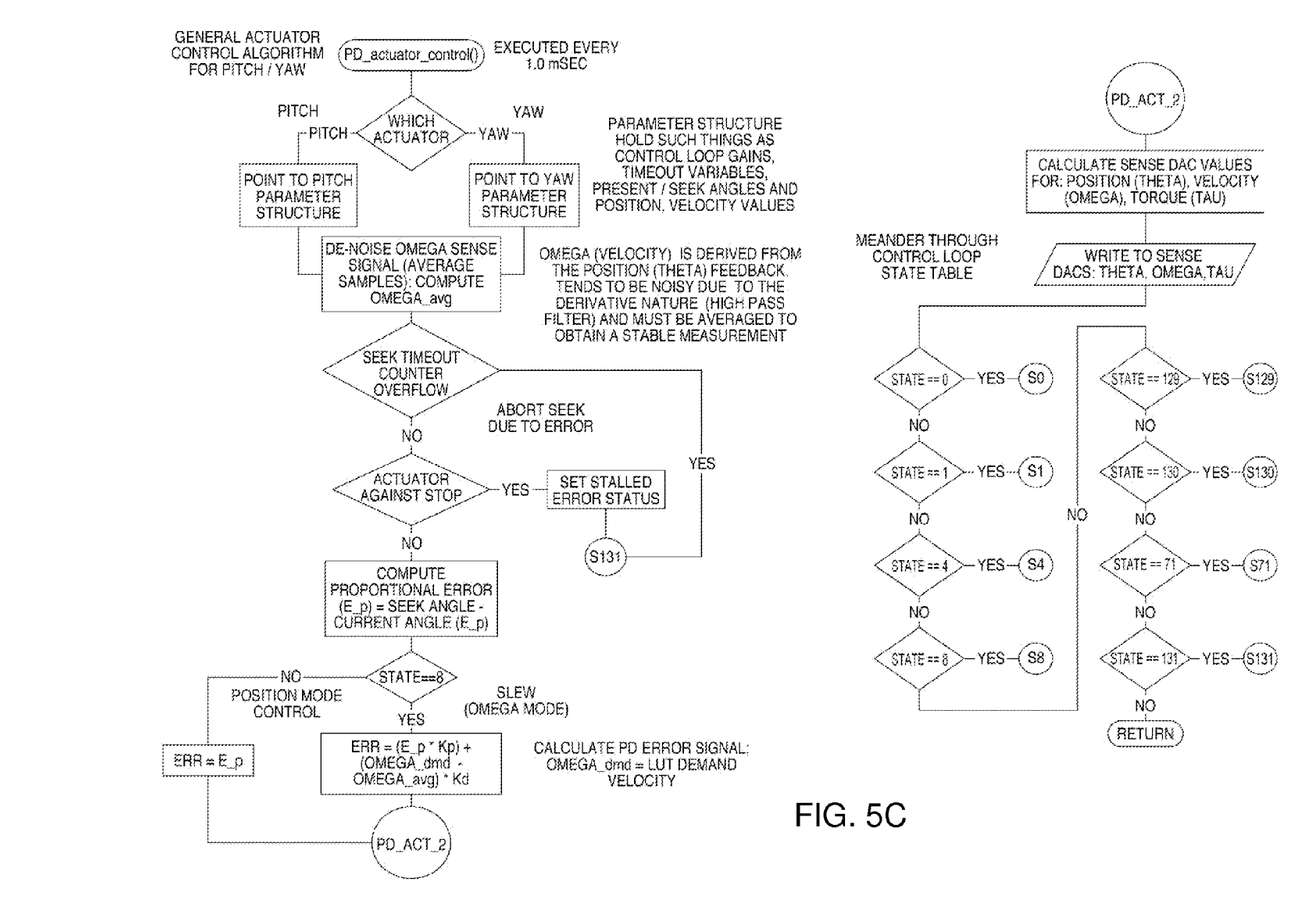

FIG. 5C shows detail of the actuator seek position control loop showing a preferred embodiment of two actuator control techniques with the use of predefined conditional states. These control stages are executed in steps 168 and 170 in FIG. 5B. The general actuator control algorithm for pitch/yaw may be executed every 1.0 msec. First, a determination is made at 184 whether pitch or yaw is being controlled. If yaw, the yaw parameter structure is pointed to at 186. If pitch, the pitch parameter structure is pointed to at 188. The parameter structure holds information about a control loop gains, timeout variables, present/seek angles and position and velocity values.

In step 190, an omega sensor signal (average samples) is de-noised and Omega_avg is computed. Omega (velocity) is derived from the position (theta) feedback and tends to be noisy due to the derivative nature (high pass filters) and is preferably averaged to obtain a stable measurement.

In step 192, a determination is made as to whether a seek timeout counter overflows, and if not, a determination is made in step 194 as to whether the actuator is against a stop. If not, a proportional effort (E_p) is computed in step 196, which equals a seek angle less the current angle.

Figure 5D:
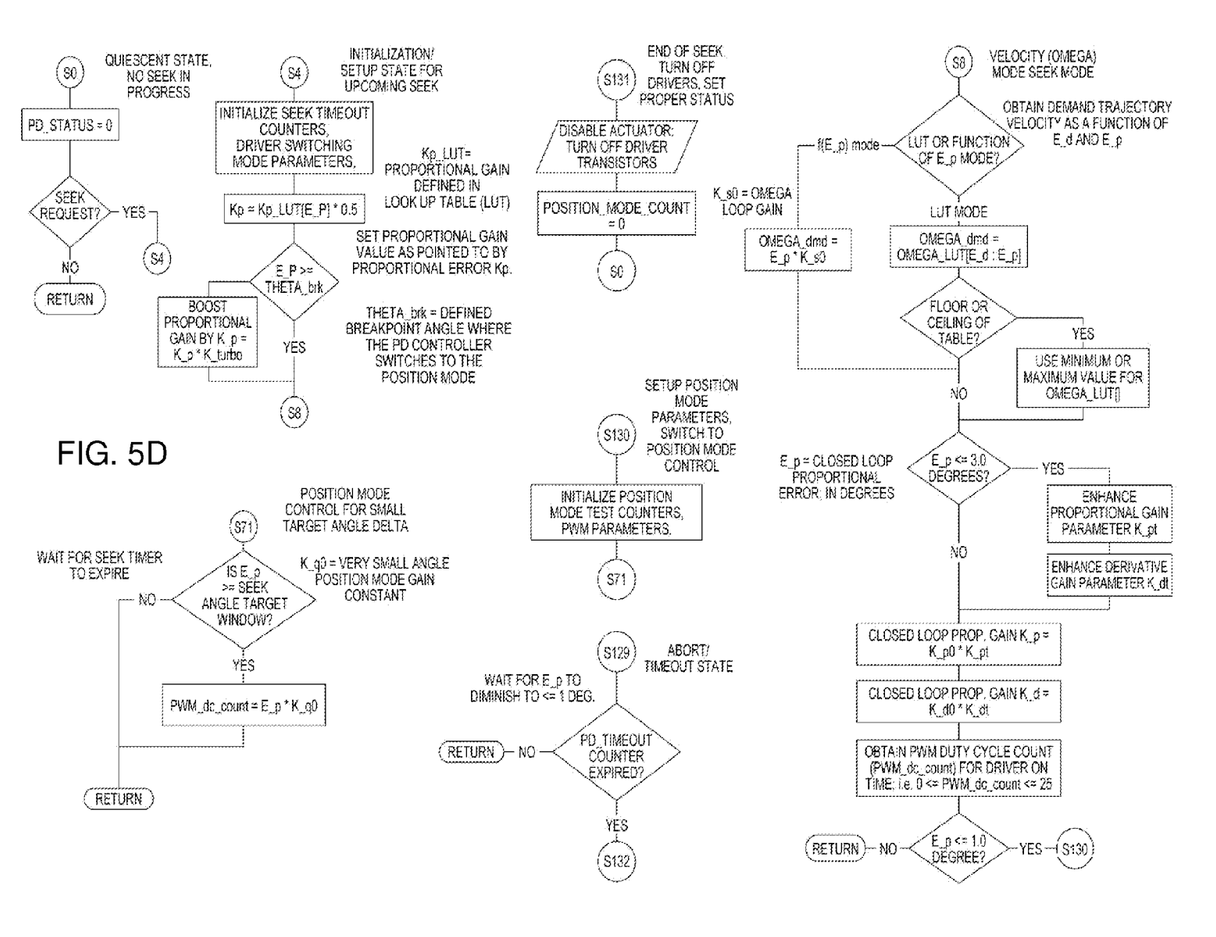

If in step 192, the seek timeout counter overflows, the process proceeds to step 200, subroutine S131 (see FIG. 5D). Also, if it is determined in step 194 that the actuator is against a stop, the process proceeds to set a stalled error status in step 198 and then proceeds to step 200, subroutine S131.

Subroutine S131 functions to end the seek turn off divers and set the proper status. As shown in FIG. 5D, in step 200A, the actuator is disabled and the driver transistors are turned off. The position_mode_count is then set to zero in step 200b and the process returns to subroutine S0, step 248.

From step 196, a determination is made whether the state is equal to eight in step 202, and if not, the position mode control operates to set an ERR variable to the proportional error (E_p), and continues to the second part 208 of the process. If state is equal to eight, then the ERR variable is set in step 206 to )E_p*Kp)+(OMEGA_dmd-OMEGA-avg)*Kd. This constitutes a calculation of the PD error signal wherein OMEGA-dmd is the look-up table (LUT) demand velocity.

In the second part 208 of the process, sense DAC values are calculated for the position (theta), velocity (omega) and torque (tau). In step 210, the variables Theta, Omega and Tau are then written to the sensor DACs in step 212. The process then meanders through a control loop state table.

If the State is equal to one as determined in step 214, the process proceeds to subroutine S0, step 216 (see FIG. 5D). In subroutine S0, the PD_Status is set to zero in step 216A, a determination of whether there is a seek request is made in step 216B and if not, the process returns in step 216C. If there is a seek request, the process proceeds to subroutine S4, step 224.

If the State is equal to four as determined in step 222, the process proceeds to subroutine S4, step 224 (see FIG. 5D). In subroutine S4, seek timeout counters, driver switching mode parameters are initialized in step 224A, Kp is set to Kp_LUT (E_P)*0.5 in step 224B. The parameter Kp_LUT is the proportional gain defined in a look-up table (LUT). A determination is made at step 224C whether the variable E_P is greater than or equal to the Theta_brk, which is defined as the breakpoint angle where the PD controller switches to the position mode. If so, the subroutine proceeds to subroutine S8, in step 228. If not, in step 224D, the proportional gain is boosted by K_turbo so that K-p equals K-P*K_turbo, and the subroutine proceeds to subroutine S8, in step 228

If the State is equal to eight as determined in step 226, the process proceeds to subroutine S8, step 228 (see FIG. 5D). In subroutine S8, the trajectory velocity demand is obtained as a function of E_d and E-p in step 228, wherein a determination is made as to whether the demand trajectory velocity is from a look-up table or a function of the E_p mode in step 228A. If a function of the E_p mode, the variable OMEGA_dmd is calculated as E_p*K_s0 in step 228D and the process proceeds to step 228F. If a function of the look-up table, the variable OMEGA_dmd is calculated as OMEGA-LUT(E_d: E_p) in step 228B, a determination is made as to whether the variable is at the floor or the ceiling of the table in step 228C. If not, the process proceeds to step 228F. If so, the minimum or maximum value for OMEGA_LUT is used in step 228E.

In step 228F, a determination is made whether E_P is less than or equal to 3.0 degrees. If so, the proportional gain parameter K_pt is enhanced in step 228G and the derivative gain parameter K_dt is enhanced in step 228H. The process proceeds to step 228I, also when E_P is not determined to be less than or equal to 3.0 degrees.

In step 228I, the closed loop prop gain K_p is calculated to be K_p0*K_pt, then in step 228J, the closed loop prop gain K_d is calculated to be K_d0*K_dt, and in step 228K, the PWM duty cycle count (PWM_dc_count) for the driver on time is obtained, e.g., in a range between greater than or equal to zero and less than or equal to 25. A determination is then made at 228L as to whether E_P is less than or equal to 1.0 degree and if not, the process returns at step 228M. If it is, the process proceeds to subroutine S130, in step 236.

Referring back to FIG. 5C, if the State is equal to one-hundred twenty-nine as determined in step 230, the process proceeds to subroutine S129, step 232 (see FIG. 5D). In subroutine S129, a determination is made whether the PD_TIMEOUT counter expired, and if not, the process returns at step 232B. If the counter expired, the process proceeds to subroutine S132, in step 232C.

If the State is equal to one-hundred thirty as determined in step 234, the process proceeds to subroutine S130, step 236

(see FIG. 5D). In subroutine S130, the position, mode test counters and PWM parameters are initialized in step 236A and then the process proceeds to subroutine S71, in step 240.

If the State is equal to seventy-one as determined in step 238, the process proceeds to subroutine S71, step 240 (see FIG. 5D). In subroutine S71, a determination is made as to whether the E–P is greater than or equal to the seek angle target window in step 240A and if not, the process returns at step 240C. If E_p is greater than or equal to the seek angle target window, the variable PWM_dc_count is set to equal E_p*K_q0 in step 240B and the process returns at step 240C.

If the State is equal to one-hundred thirty-one as determined in step 242, the process proceeds to subroutine S131, step 200 (see FIG. 5D), which is discussed above.

If the State is equal to one-hundred thirty-two as determined in step 243, the process proceeds to subroutine S132, step 244 (see FIG. 5D). In subroutine S132, the position mode counter is incremented in step 244A. A determination is made as to whether the position mode counter is greater than the maximum value in step 244B. If greater than the maximum value, the process proceeds to S0 in step 244, and if not the process returns at step 244D.

If the State does not equal any of the numbers mentioned above, the process returns at step 246.

The structure and functionality disclosed above may be implemented using software and/or hardware and would be able to be constructed by one of ordinary skill in the art to which this invention pertains in view of the disclosure herein. Generally, the structure and functionality would be implemented using one or more electronic components and a program that controls and/or configures the electronic component(s) to provide the desired functionality. The drawings illustrate non-limiting exemplifying embodiments and other electronic components and configurations or assemblies of electronic components may also be used.

Several computer programs resident on transitory or non-transitory computer-readable media may be used in the invention. For example, one or more computer programs is/are designed to control the control logic 8 to cause testing drive signals to be generated by the drivers 12, 14, 16, sense and monitor the current and voltage readings from the drivers 12, 14, 16, monitor the feedback signals received by the actuator drivers 14, perform the self-testing of the drivers 12, 14, 16 using the driver self-test loads 6, if desired (see FIG. 1), and initiate and set the control logic 8 to perform the command interpretation shown in FIG. 3.

In the context of this document, computer-readable media or medium could be any non-transitory means that can contain, store, communicate, propagate or transmit a program for use by or in connection with the method, system, apparatus or device. The computer-readable medium can be, but is not limited to (not an exhaustive list), electronic, magnetic, optical, electromagnetic, infrared, or semi-conductor propagation medium. The medium can also be (not an exhaustive list) an electrical connection having one or more wires, a portable computer diskette, a random access memory (RAM), a read-only memory (ROM), an erasable, programmable, read-only memory (EPROM or Flash memory), an optical fiber, and a portable compact disk read-only memory (CDROM). The medium can also be paper or other suitable medium upon which a program is printed, as the program can be electronically captured, via for example, optical scanning of the paper or other medium, then compiled, interpreted, or otherwise processed in a suitable manner, if necessary, and then stored in a computer memory. Also, a computer program or data may be transferred to another computer-readable medium by any suitable process such as by scanning the computer-readable medium.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and is not limiting. The invention is limited only as defined in the claims and equivalents thereto.

The invention claimed is:

1. A method for generating drive signals to test an assembly including a valve, an actuator and a switch motor, comprising:
controlling a valve driver, an actuator driver and a motor driver from a processor to cause testing drive signals to be directed to the valve, actuator and motor, respectively;
configuring the processor to sense and monitor drive voltage and current of the valve driver, actuator driver and motor driver;
receiving feedback signals at the processor in response to the operation of the actuator based on the testing signals directed to the actuator via the actuator driver; and
determining, based on the feedback signals, commands at the processor to cause additional testing signals to be directed to the valve, actuator and motor via the valve driver, actuator driver and motor driver,
whereby the drive voltage and current and feedback signals are analyzed to assess operational characteristics of the assembly.

2. The method of claim 1, wherein the valve, actuator and motor are part of a liquid rocket stage, the valve is a solenoid valve, the motor is a direct current motor and the actuator is a direct current actuator.

3. The method of claim 1, further comprising generating a signal proportional to the current for the purpose of analyzing current profiles as part of a test regimen for the assembly.

4. The method of claim 1, further comprising configuring the processor to control velocity and positioning of the motor via drive signals being directed to the motor driver.

5. The method of claim 1, further comprising coupling the valve driver, motor driver and actuator driver to a common drive voltage such that change of the common drive voltage causes a change in the drive voltages to the valve driver, motor driver and actuator driver simultaneously.

6. A system for generating drive signals to test an assembly including at least one valve, at least one actuator and at least one switch motor, comprising:
a valve driver associated with each of the at least one valve;
an actuator driver associated with each of the at least one actuator:
a motor driver associated with each of the at least one motor;
a processor coupled to said at least one valve driver, said at least one actuator driver and said at least one motor driver,
said processor being configured to:
cause testing drive signals to be directed to the at least one valve via the respective one of said at least one valve driver;
cause testing drive signals to be directed to the at least one actuator via the respective one of said at least one actuator driver;

cause testing drive signals to be directed to the at least one motor via the respective one of said at least one motor driver;

sense and monitor drive voltage and current of said at least one valve driver, said at least one actuator driver and said at least one motor driver;

receive feedback signals in response to the operation of the at least one actuator based on the testing signals directed to the at least one actuator via the at least one actuator driver; and determine, based on the feedback signals, commands to cause additional testing drive signals to be directed to the at least one valve, the at least one actuator and the at least one motor via said at least one valve driver, said at least one actuator driver and said at least one motor driver, whereby the drive voltage and current and feedback signals are analyzed to assess operational characteristics of the assembly.

7. The system of claim 6, wherein the at least one valve, the at least one actuator and the at least one motor are part of a liquid rocket stage, the at least one valve comprises a solenoid valve, the at least one motor comprises a direct current motor and the at least one actuator comprises a direct current actuator.

8. The system of claim 6, further comprising a common drive leading to said at least one valve driver, said at least one motor driver and said at least one actuator driver such that change of the common drive voltage causes a change in the drive voltages to said at least one valve driver, said at least one motor driver and said at least one actuator driver simultaneously.

9. The system of claim 6, further comprising driver self-test loads, said processor being configured to enable self-testing of said at least one valve driver, said at least one motor driver and said at least one actuator driver using said driver self-test loads.

10. The system of claim 6, wherein said at least one valve driver is configured to direct two testing drive signals to the respective valve.

11. The system of claim 6, wherein said at least one valve driver is configured to supply a high current FET switch that connects the system power to the at least one valve.

12. The system of claim 11, wherein said at least one valve driver is configured to supply a matching network including at least one zener diode and at least one snubber resistor such that valve hysteresis current does not produce large voltage spikes at the FET switch.

13. The system of claim 6, wherein said at least one valve driver is configured to supply a programmable current to the at least one valve, said at least one actuator driver is configured to supply a programmable current to the at least one actuator, and said at least one motor driver is configured to supply a programmable current to the at least one motor.

14. The system of claim 6, wherein each of said at least one actuator driver is configured to direct three testing drive signals to the respective actuator including an extend, a retract and a common signal.

15. The system of claim 6, wherein said at least one actuator driver is configured to supply a high current FET switch that connects the system power to extend and retract motors of the at least one actuator.

16. The system of claim 15, wherein said at least one actuator driver is configured to supply a matching network including at least one zener diode and at least one snubber resistor such that extend and retract motor hysteresis current does not produce large voltage spikes at the FET switch.

17. The system of claim 6, wherein each of said at least one motor driver is configured to direct three testing drive signals to the respective motor including an open, a close and a common signal.

18. The system of claim 6, wherein said at least one motor driver is configured to supply a high current FET switch that connects the system power to the at least one switch.

19. The system of claim 18, wherein said at least one motor driver is configured to supply a matching network including at least one zener diode and at least one snubber resistor such that motorized switch hysteresis current does not produce large voltage spikes at the FET switch.

\* \* \* \* \*